SURFACE-CONTOURED, ENERGY-TRANSFORMING SOLID-STATE DEVICE

Filed Feb. 25, 1969

Inventor
Chou H. Li

United States Patent Office 3,500,135
Patented Mar. 10, 1970

3,500,135
SURFACE-CONTOURED, ENERGY-TRANSFORMING SOLID-STATE DEVICE
Chou H. Li, 379 Elm Drive, Roslyn, N.Y. 11576
Continuation-in-part of application Ser. No. 490,955, Sept. 28, 1965. This application Feb. 25, 1969, Ser. No. 802,018
Int. Cl. H01l 15/02
U.S. Cl. 317—234 22 Claims

ABSTRACT OF THE DISCLOSURE

The invention relates to improving the performance of energy-transforming solid-state device by differentially expanding the peripheral surface of the junction region and nearby cooperative, optoelectrically active region into special geometrical shape so as to turn a significant portion of parallel light rays thereon into non-parallel reflected rays convergent onto selected location on the light-collecting junction region surface thereby achieving both device surface stabilization and efficiency enhancement.

This is a continuation-in-part of my pending application Ser. No. 490,955, filed Sept. 28, 1965, now Patent No. 3,430,109.

The invention relates to energy-transforming optoelectromagnetic solid-state device and more particularly to energy-transforming optoelectrical solid-state device having specially contoured peripheral device surface at and near the junction region.

My aforementioned copending application describes, among other things, novel energy-transforming solid-state devices made with special attention to the configuration of the peripheral surface of the junction and nearby cooperative, optoelectrically active region whereby this surface is differentially expanded into prescribed geometrical shape, such as a surface of revolution or, in general, a surface of oriented arcuate cross-section, to achieve improved results and efficiencies of such energy transformation and/or signal translation.

I have shown that differential expansion allows the exposed junction surface to be practically and greatly expanded so as to reduce the surface field gradient and hence Type I or accumulating contaminants. The specially-contoured junction and device surface makes the junction resistant, through curvature effects, to contamination by Type II or rubbing contaminants. The differentially expanded junctions are effective even against rubbing contamination by submicron floating particles, or particles smaller than the junction widths or thicknesses. Against these particles, beveling or mere device surface contouring, no matter how much, is totally ineffective.

The increased surface area at and near the junction region has the added advantage of allowing more surface cooling or more effective carriers injection through impacts by radiation particles. Further, the differentially expanded peripheral surface possess the inherent property of modulating the direction of parallel or substantially parallel incoming radiation rays. By this I mean that parallel incoming radiation rays are converged by a concave peripheral surface, but diverged by a convex surface. In addition, with a cylindrically concave or many other specially contoured surface, this direction modulation is systematic. This means that the amount or degree of this direction modulation on suitable incoming rays is monotonic increasing, usually from zero to a maximum, along a curved line on a significant portion of the expanded surface. Such direction modulation does not exist with linearly, or non-differentially, expanded peripheral surfaces.

In this invention, the optimal shapes of such surface-contoured devices are described. Also described is a novel method for applying a conductive reflective film to further improve the efficiency of such energy-transforming devices.

In brief summary, the invention relates to improving both the surface stabilization and energy-transformation characteristics of solid-state device by surface-contouring the junction and nearby cooperative, optoelectrically active region into special geometrical shape designed to reflect a significant portion of incoming light rays thereon into non-parallel reflected rays convergent onto selected location on the light-collecting junction surface.

While not limited thereto, the invention is herein described as applied to a semiconductor device having a pn junction as part of its optoelectrically active region.

An important object of the invention is to achieve surface-contoured, energy-transforming solid-state device having controlled optoelectrical device response to the ambient.

Another object of the invention is to improve both the device surface stabilization and energy-transformation characteristics.

Another object is to obtain device having a peripheral surface contour geometrically optimized for both efficient light emission under forward bias and light collection under reverse bias.

Another object is to produce device capable of emitting highly parallel rays of radiation particles.

Yet another object is to acquire light-collecting device capable of converting input light signals into high-purity electrical output signals.

A further object is to obtain light-coupled complementary devices of novel design and operating characteristics.

A still further object is to provide means and methods for further enhancing the performance of the above devices by means of improved reflective surface films.

Further objects and advantages of my invention will appear as the specification proceeds.

The preferred form of the invention is illustrated in the accompanying drawing, in which.

Figures 1, 2, 3, 4, 5, 6, 7, 8, 9:
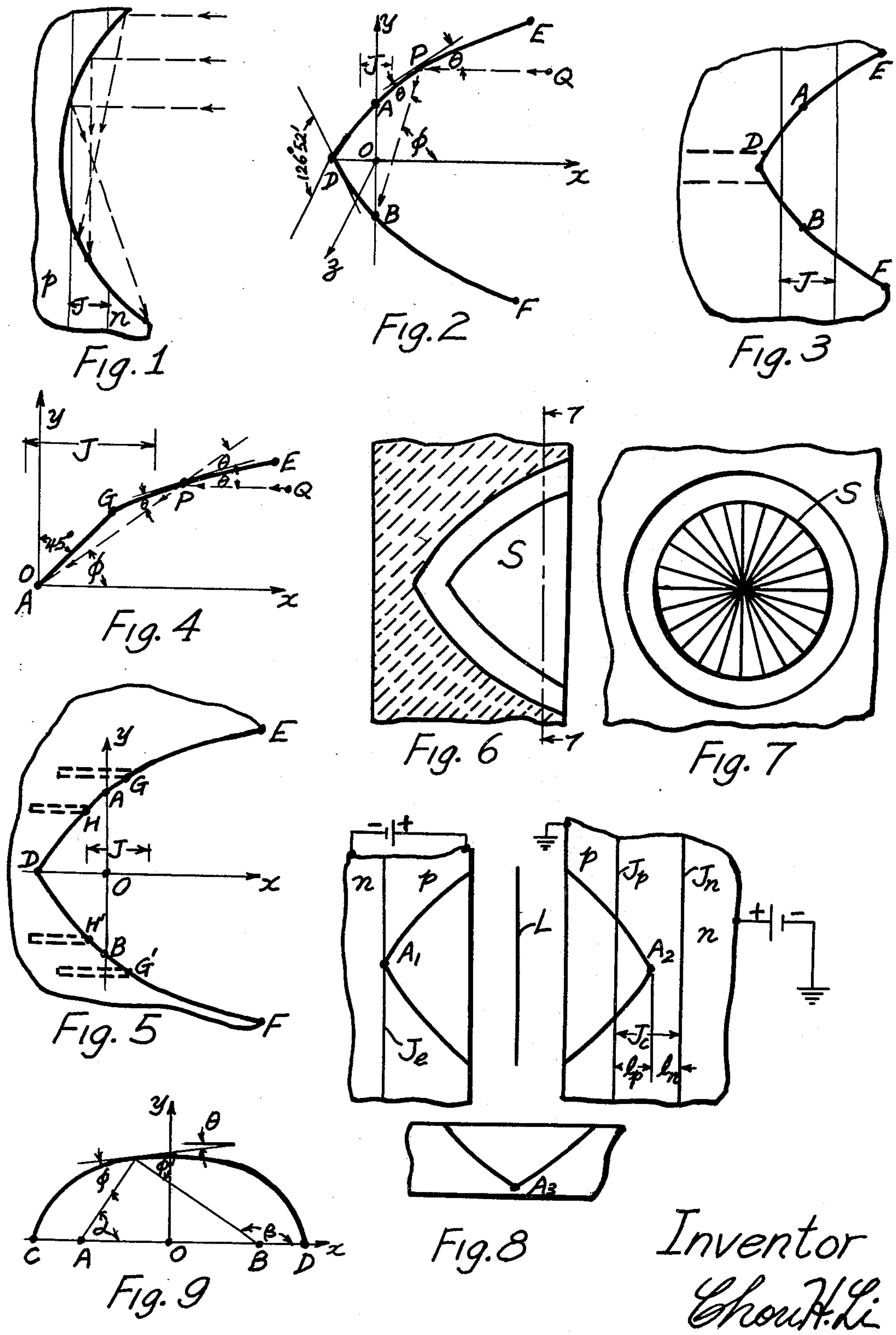
FIG. 1 is a cross-section of a cylindrically surface-contoured diode.
FIG. 2 shows the first type of optimal surface contour.
FIG. 3 is a cross-section of a device based on the first type optimal surface contour.
FIG. 4 shows a second type of optimal surface contour.
FIG. 5 is a cross-section of a device having composite optimal surface contours.
FIG. 6 shows the use of a special light shield in connection with a specially surface-contoured device.
FIG. 7 is a cross-section of the device of FIG. 6, taken along the line 7—7.
FIG. 8 shows a pair of complementary optically-coupled diodes both having contoured peripheral surfaces.
FIG. 9 shows a pair of similar complementary optically-coupled diodes, but are spaced by short distance apart.

FIGURE 1, depicting a cyclindrical groove or spherical depression similar to that given in FIGURE 1 of my copending application, shows a reverse-biased semiconductor device being injected with carriers by parallel, horizontal rays of light of photons shown in broken lines. The concave peripheral junction and nearby device surface causes these rays to be reflected into non-parallel outgoing rays, distinctly convergent onto the contoured junction and nearby regions for enhanced carriers injection. These differentially expanded regions, therefore, receive significantly more of the reflected rays of a different character, i.e., convergent, than would be the case if these peripheral surface regions were merely linearly expanded.

The first type of optimal surface contour can be determined with the aid of FIG. 2. Here, the desired surface contour is represented by the curve EADBF. The incoming light rays are in the $x$–$y$ plane and normal to the $y$–$z$ plane. The light-focus points A and B represent the intersections with the x–y plane of the middle, or some other special, plane of the junction region J. The coordinates of these points are, respectively, $(0, b)$ and $(0, -b)$. It is required that all horizontal rays on the upper portion of the peripheral surface DAE be reflected exactly to focus point B, while similar rays on the lower portion DBF be reflected exactly to focus point A. Since, for a typical ray shown as QPB, $2\theta=\phi$, hence: $\tan 2\theta=\tan \phi=(y+b)/x=2 \tan \theta/(1-\tan^2\theta)=2y'/(1=y'^2)$ where $y'=dy/dx=\tan \theta$. Hence:

$$(y+b)\ y'^2+2xy'-(y+b)=0,$$

and $$dy/dx=y'=[\sqrt{x^2+(y+b)^2}-x]/(y+b) \text{ for } y\geq 0$$

The solution of the last equation, for the applicable boundary conditions, is obtained by substituting a new variable $t$ such that $y=x \tan t-b$. This solution is:

$$\sqrt{x^2+(y+b)^2}-x=2b, \text{ for } y\geq 0$$

At point D where $y_D=0$, $x_D=-3b/4$, and the tangent to the upper portion DAE makes with the $x$-axis an angle $\theta_{Du}=\tan^{-1} 2.0=63°26'$.

By symmetry, the corresponding equations for the lower portion DBF are:

$$(b-y)\ y'^2-2xy'-(b-y)=0$$

$$y'=[\sqrt{x^2+(b-y)^2}-x]/(b-y) \text{ for } y\leq 0$$

and $$\sqrt{x^2+(b-y)^2}-x=2b \text{ for } y\leq 0$$

Also, the tangent at D to the lower portion DBF makes with the $x$-axis an angle $\theta_{Du}=63°26'$.

Hence, the complete curve EADBF is not a parabola but consists of two separate and distinct portions or subcurves each requiring a unique tangent at the point D.

Devices having the above optimal surface contours include those whose cross-sections are shown in FIGURE 3. The upper and lower portions, DAE and DBF respectively, must meet exactly at the singular point D at an angle of 126°52'. This may be difficult to achieve because of the finite machining radius, thereby causing some of the incoming rays to be reflected not exactly to point A or B. To cure this deficiency and to insure 100% of the reflected rays striking points A and B, a central groove or hole may be machined into the device as shown by the dotted lines.

With the second type of optimal surface contour, all the incoming parallel rays slightly above point A are to be reflected exactly to point A (see FIG. 4). Let the upper portion or subcurve start at the lower or inner end point G, having coordinates $(a, b+c)$, where $b=0$. Similar reasoning gives:

$$\tan 2\theta=2y'/(1=y'^2)=\tan \phi=y/x$$

whence:

$$y\ y'^2+2xy'-y=0$$

for $x\geq a$ and $y\geq b+c$.

$$dy/dx=y'=[\sqrt{x^2+(y-b)^2}-x]/y$$

for $x\geq a$ and $y\geq b+c$. Hence, $$\sqrt{x^2+y^2}-x=\sqrt{a^2+c^2}-a$$

for $x\geq a$ and $y\geq b+c$.

The portion between points A and G may be determined for two special cases. In the first case, AG is assumed to be a straight line making 45° with both the $x$ and $y$-axes. Then, $a=c$, and the horizontal light rays coming onto AG will be reflected vertically downward for collection onto, for example, a junction region B directly underneath A. The slope of the portion GE at G is then $\theta_G=22°30'\neq 45°$, since $$y_G'[\sqrt{a^2+c^2}-a]/c=0.4142$$

Hence, the slope to the entire curve AGE changes discontinuously from 45° to 22°30' at G.

In the second special case, the curve AGE is to have a constant slope at G. The equation for the portion AG is then:

$$y^2=4a[\sqrt{a^2+c^2}-a/c]^2.x$$

Devices similar to that shown in FIG. 3 but according to the second type of optimal surface contour are easily designed, either to have straight or curved AG portions. Devices having the optimal surface contours on the outside peripheries, rather than inside the depressions shown in FIG. 3, are also possible here, the junction regions then extending either to or beyond A and/or G. Because the curved AG portion has a parabolic form, the tangent thereto at A coincides with the $y$-axis, making it easier to machine than the first special case with straight AG portion. However, light rays reflected from the curved AG portion are lost to either A or B. In such a case, therefore, the values of $a$ and $c$ should be held small to minimize such losses of reflected rays.

The device whose cross-section is shown in FIG. 5 has a composite surface contour such that incoming rays parallel to the $x$-axis are reflected from the GE portion to point A and from the 45° line HAG and the DH portion to point B. The point H has coordinates $(-e, b-e)$, where $e$ may be either positive or zero. The lower portion DBF may be symmetrical to the upper portion DAE with respect to the $x$-axis. If the two junction regions containing points A and B respectively are electrically isolated, this device is then sensitive to the vertical positioning of the incoming rays. The equation of DH is:

$$\sqrt{(x+a)^2+(y+b-e)^2}-(x+a)=2(b-e), \text{ for } b-e\geq y\geq 0$$

The slope to the portion DH at H is such that $\tan \theta_H=(2b-a-2e)/(2b-a-e)=1-e/(2b-a-e)$ which, for non-zero, $e$ is always not equal to 1 or tan 45° Therefore, if the DHG portion of the surface is not properly machined, some reflected rays may be lost to point B. This deficiency may be cured by additional relief grooves or holes at H, G, H', and G', as shown in the dotted lines in FIG. 5.

The above devices may also be forward biased to inject carirers by electrical means into the junction region for recombination. In this way, electrical energy is transformed into optical or thermal energy. Emitted rays of the newly transformed energy may be reflected by the same special surface contours to achieve parallel output rays of optical or thermal character, such as ultraviolet, visible, or infrared rays. Further, these devices may each be provided with a light shield S, as shown in FIGS. 6 and 7, so that these junction-emitted rays are restricted to travel only in their respective planes designed for optimal reflection from the contoured surface, thereby insuring perfect parallelism of the reflected rays outgoing from the emitting diode.

FIG. 8 shows a pair of reversible or complementary diodes, aligned face-to-face. Alternately or constantly, one of the diodes is to be forward-biased to act as a light-emitter through the thin (generally less than one micron junction region $J_e$, the emitted rays being preferably made parallel by the special surface contour. The other diode then acts as parallel-light collector through the special surface contour thereon and the much wider reversed-biased junction region $J_c$. This diode can be designed to be very sensitive to its orientation with respect to the direction of the reflected light rays. These diodes may also have shields similar to that shown in FIGS. 6 and 7 to insure parallelism of the reflected rays to be collected. In addition, between these diodes, a light detector L may be provided for controlling the emitted light intensity or other characteristics by, for example, feedback means. Alternately, L may be a emitted light modulator such as a chopper, a replaceable lens system, or even a variable-position prism or mirror for controllably switching the parallel rays from the emitting diode to point $A_2$ or $A_3$ on different collecting diodes. By changing the shape or rotation speed of the chopper, or the applied forward or reverse bias on the diodes, either singly or in combination, the signal responses of these coupled diodes can be controllably varied. Alternately, these coupled diodes may be used to calibrate the shape or rotation of the chopper, or the forward or reverse bias on the diodes.

The position of point A on the reverse-biased light-collecting diode may be carefully designed for the following novel results. An incoming photon from the emitting rays may generate at $A_2$ two paired carriers, i.e., an electron and a hole, to be separated by the reverse bias. The electron goes (right) to the anode while the hole (left) to the cathode. The speed of movements or transit times for the hole and electron, $t_h$ and $t_e$ respectively, depend on the field strength in the junction region and hole and electron mobilities $u_h$ and $u_e$. For a uniform field and constant mobilities, and neglecting the curved electron path, if the junction depths and mobilities are so related that $l_p/u_h=l_n/u_e=J_c/(u_h+u_e)$, then $t_h=t_e$, and the electron and hole are collected respectively at the junction end surfaces, $J_n$ and $J_p$, at exactly the same time. This gives a "pure" or high-purity signal in the sense that the current pulse is now doubled in magnitude but of the same narrow bandwidth or resolution as would occur upon the collection of a single carrier of either type. Further, there will now be no additional built-in voltage in the junction region resulting from differential collection rates of electrons and holes, respectively at $J_n$ and $J_p$. Suitable designs for non-uniform fields, variable mobilities, and corrected paths lengths and geometries, may be similarly designed by solving the appropriate differential equations, or, by trying out on the actual devices.

Further, by modulating the forward bias at the emitter, and/or the reverse bias at the collector, the emitter light from $J_e$ and carriers generations and recommenbinations at $J_c$ may be modified at will. Even the junction widths $J_e$ and, in particular, $J_c$, may be controllably varied. Because each surface contour is optimized essentially for a prespecified junction width, variations in applied biases and, hence, junction widths $J_e$ and $J_c$, result in different degrees of parallelisms of emitted light or different "purity" of electrical signal and other characteristics of the light-collecting diode. This simple, versatile, solid-state diode system may be used for communication work, equipment alignment, voltage calibration, "pure" signal or light generation, and other purposes.

Various combinations of the different surface contours or device designs are possible for other novel systems. Further, these surface contours remain more or less optimal even if the incoming light rays are slightly non-parallel. In this case, the reflected rays may be slightly off the points A and B, but still may be well or mostly within the junction regions. In addition, the incoming rays need not be light rays, but may be rays of other high-energy particles possessing energies exceeding those required to generate electron-hole pairs. Even heat particles may be used to achieve thermal generation of carriers.

A pair of optically-coupled diodes may even be located nearby, as shown in FIG. 9. The light rays emitted by one diode, however, are non-parallel in this case but, nonetheless, reflected from the diode surface into convergent rays onto suitable light-collecting regions on the other diode. Here, the coordinates of points A, B, C, and D are respectively $(-a, 0)$, $(a, 0)$, $(-b, 0)$, and $(b, 0)$. Also, for the left diode emitting light at A and the right diode collecting light at B, for example, $\tan\alpha=y/(x+a)$, $\tan\beta=y/(x-a)$, and $\tan\theta=y'=dy/dx$. Since $\phi=180°-\beta+\theta=\alpha-\theta$, therefore, $\tan(\theta-\beta)=\tan(\alpha-\theta)$, and $$2xyy'^2+2[(x^2-a^2)-y^2]y'-2xy=0 \text{ for } y\geq 0$$
$$-b\leq x\leq b$$

and $$y'=dy/dx=[y^2+a^2-x^2-\sqrt{(y^2+a^2-x^2)^2+4x^2y^2}]/2xy$$

also for $y\geq 0$ and $-b\leq x\leq b$.

To increase the reflectiveness of the peripheral surface to the incoming rays, special reflective films may be deposited thereon. A vacuum-evaporated aluminum or silver film of even fractional micron thickness, for example, is very effective for such purposes. These reflective films are usually metallic and conductive. To prevent them from shunting out the junction region, an energy is to be applied, during the film deposition, in such a way that the energy is more concentrated right at the junction region so as to make the applied film permanently ineffective, preferably instantly, in shunting out the junction. Such energy may be a reverse bias or suitable heat rays. These heat rays should preferably be parallel and oriented so as to use the same peripheral contour surface to form a sharply convergent or defined heating area at point A or B. By making these heat rays slightly non-parallel, through proper location of the ray source or suitable lens systems, the sharply defined area can be spread to cover the entire junction region, rather than merely at the points or lines at A and B. The concentrated energy causes the applied film in the form of discretely deposited particles or otherwise, to evaporate, to be oxidized, to globulize and thus be made discontinuous, or otherwise to be made relatively inert in the junction region. A constantly applied reverse bias is particularly effective in instantly burning off momentarily connected current-carrying paths made of collected particulate materials from a stream of deposited, discrete, conductive particles. These conductive paths, if allowed to build to sufficient thicknesses, may not be removable by any reverse bias without permanent damages to the device characteristics.

It is evident that the portion of the device whose surface is represented by the curve EADBF simultaneously serves a number of important functions, i.e., physical support, surface passivator, bias application means, path for carrier movement, expanded junction region and nearby region for efficient carriers injection and collection, and reflection for efficient use of incoming rays.

For clarity of illustration, all the devices described above are diodes only. Skilled persons can easily add one or more material layers to be arranged in succession with the other two material layers of the diode, i.e., p-type and n-type layers. Contiguous layers here must have opposite or otherwise different electronic conductivities thereby forming a plurality of rectifying pn or other barrier regions in the combined form of an optoelectrically active region. A significant portion of this active region is to have differentially expanded peripheral surface across at least two of these material layers and geometrically contoured to turn parallel light rays thereon into non-parallel reflected rays convergent onto a selected junction region, the emitter junction in a transistor, for example. This allows the device to have controllably variable performance characteristics through its response to incoming rays of radiation particles striking on the contoured peripheral surface.

The invention is not to be construed as limited to the particular forms disclosed herein, since these are to be regarded as illustrative rather than restrictive. For engineering, economical, or other reasons, for example, devices may often be made only partly according to the present invention. These devices may have surface contours not exactly in accordance with, but only approximating to, the above-given optimal shapes. Nevertheless, they will still achieve partially benefical results.

I claim:

1. An energy-transforming solid-state device comprising two contiguous solid-state material layers, an interfacial rectifying barrier region therebetween, and a depression originating from one of the layers but penetrating past the barrier region thereby exposing a non-planar peripheral surface on both the barrier region and its nearby region in at least one of the two layers, the barrier region being properly biased and adapted to transform energy from one type to another, one of the types being in the form of radiation particles at the peripheral surface of the barrier region and the other type being in the form of electrical energy at the two end or terminal surfaces of the barrier region, the peripheral surface being differentially expanded and geometrically shaped so as to have the property of turning at least a preselected, significant portion of parallel light rays thereon into non-parallel reflected rays convergent onto a light-collecting region on the peripheral surface and including at least a selected location on the barrier region surface to thereby improve the performance of the device in the energy transformation.

2. The device of claim 1 including at least an additional solid-state material layer arranged in succession with the other two material layers, contiguous layers being of opposite electronic conductivity types thereby forming a plurality of rectifying pn junction regions in the combined form of an optoelectrically active region, a portion of the active region being differentially expanded on the peripheral surface across at least two of these layers and geometrically contoured to turn parallel light rays thereon into non-parallel, reflected rays convergent onto a selected junction region thereby allowing the device to have controllably variable performance characteristics through its response to incoming rays of radiation particles striking on the contoured peripheral surface.

3. The device of claim 1 wherein the barrier region consists of a pn junction region, the light rays lie in a predetermined plane locally normal to the barrier region, and the light-collecting region consists of essentially two singular points located in the same predetermined plane.

4. The device of claim 3 wherein the intersection of the peripheral surface and the predetermined plane is a curve a significant portion of which is representable by the following differential equation in terms of a set of rectangular $x$–$y$–$z$ coordinates:

$$t(dt/dx)^2+2x(dt/dx)-t=0$$

where the $y$-axis joins the two singular points at a distance $2b$ apart, and the $x$-axis is normal to but also bisects the straight line joining these two points, while $t$ differs from $y$ by exactly $b$ which is non-negative.

5. The device of claim 4 wherein the portion of the curve to one side of the $x$-axis is substantially representable by the following differential equation in terms of the same $x$–$y$ coordinates:

$$(y+b)(dy/dx)^2+2x(dy/dx)-(y+b)=0$$

for $y \geqq 0$.

6. The device of claim 4 wherein the peripheral surface is representable by a common surface of revolution generated from a generating curve representable by the following differential equation in terms of the same $x$–$y$ coordinates:

$$(y+b)(dy/dx)^2+2x(dy/dx)-(y+b)=0$$

for $y \geqq 0$.

7. The device of claim 4 wherein the curve is representable by the following equation in the same $x$–$y$ coordinates:

$$\sqrt{x^2+t^2}-x=\text{constant}$$

where $t=b+y$ for the portion of the curve above the $x$-axis but $t=b-y$ for the portion below the $x$-axis.

8. The device of claim 4 wherein the two singular points coincide with the origin of the $x$–$y$ coordinates and a cross-section of the contoured peripheral surface is a curve representable by the following equation:

$$\sqrt{x^2+y^2}-x=\sqrt{a^2+c^2}-a$$

where $a$ and $c$ are positive $x$- and $y$-coordinates of the inner end point of the curve.

9. The device of claim 4 wherein the contoured peripheral surface includes a portion intersecting with the predetermined plane in the form of a straight line making substantially 45° with both the $x$- and $y$-axes.

10. The device of claim 4 further containing a hole starting from the surface of the depression and centered around the $x$-axis thereby insuring practically all of the reflected rays to strike only the selected light-collecting region.

11. The device of claim 1 further containing a highly reflective layer on the peripheral surface, the layer being electronically conductive outside but non-conductive inside in the barrier region.

12. The device of claim 3 wherein the pn junction region is reverse biased and $y$–$z$ plane is parallel to the two end or terminal surfaces of the junction region and located therebetween at a predetermined distance in respect to carriers mobilities and junction electrical field and surface contour to insure any two paired carriers generated in the $y$-plane by a radiation particle and moving in opposite directions under the reverse bias to reach the respective collecting end surfaces at exactly the same time after their generation.

13. The device of claim 4 wherein the pn junction region is reverse biased to give a substantially linearly-graded electrical field across the junction region, and the $y$–$z$ plane is parallel to the two end surfaces of the junction region and located therebetween at a distance $w$ from one end surface such that $w$ is substantially equal to $vJ/(u+v)$, where J is the junction region thickness, $u$ the mobility of the electronic current carriers of one type and drifting under the field from the one end surface toward the other, and $v$ the mobility of the electronic current carriers of the opposite type.

14. The device of claim 4 wherein the pn junction region is reverse biased and including means for modulating the reverse bias on the device to controllably change the collecting junction width thereby, for a fixed contour on the device peripheral surface optimized essentially for a prespecified junction width, achieving controlled variation of the light-collecting characteristics of the device.

15. The device of claim 4 wherein the pn junction region is forward biased to emit light and including means for sensing at least one characteristics of the emitted light, and feedback means operable by the sensing means to control the sensed characteristics of the emitted light at a substantially constant level.

16. The device of claim 4 wherein the pn junction region is forward biased to emit light rays and including light-shielding means centrally positioned to restrict the emitted light rays to travel substantially radially to the contoured peripheral surface, thereby insuring parallelism of the reflected, outgoing rays.

17. The device of claim 3 including a second surface-contoured, energy-transforming solid-state device of similar structural design and optically coupled to the first device, a first of these devices being forward biased to emit signal light and the second device reverse biased to serve as a light-collecting device to collect the signal light emitted by the first device.

18. The device of claim 17 including a light modulator interposed between the two devices to modulate the emitted signal light before its being collected by the second device.

19. The device of claim 17 including means for varying the characteristics of the emitted signal light in accordance with an input signal applied onto the first device, and means for translating the signal light collected by the second device into an output signal from the second device.

20. The method of improving the efficiency of an energy-transforming solid-state device of the type having an interfacial rectifying region interposed between two solid-state material layers, the region and the material layers being optically exposed to the ambient through a specially contoured peripheral surface thereof, the region further having thereacross a properly biased electrical field gradient during the operation of the device for transforming energy from one type to another, one of the types being in the form of radiation particles at and near the peripheral surface of the region and the other type being in the form of electrical energy at the two end or terminal surfaces of the region, comprising: applying a source of energy to the device in such a way that the energy is concentrated locally in preselected subregions at and near the peripheral surface of the region, applying a stream of discrete particles of a highly reflective material onto the peripheral surfaces of the region and the two material layers and in an amount sufficient to form a substantially uniform, continuous layer over the entire peripheral surface of the region and the two material layers except where there is a concentration of the applied energy, and maintaining the application of the energy during the application of the discrete particles so that discrete particles arriving onto the preselected subregions do not form a continuous layer.

21. The method of claim 20 wherein the barrier region is of the pn junction type, the applied energy is a reverse bias, and the discrete particles are electrically conductive.

22. The method of claim 20 wherein the applied energy is in the form of substantially parallel rays of energetic particles directed in suitable orientation to the contoured peripheral surface so that these rays are reflected by the peripheral surface into non-parallel rays convergent into concentrated form onto the junction region.

References Cited

UNITED STATES PATENTS

| | | | |
|---|---|---|---|
| 3,443,140 | 5/1969 | Ing et al. | 313—108 |
| 3,290,539 | 12/1966 | Langorte | 313—114 |
| 3,302,051 | 1/1967 | Galginaitis | 313—108 |
| 3,359,509 | 12/1967 | Hall | 331—94.5 |

OTHER REFERENCES

I.B.M. Technical Disclosure Bulletin, Michelitsch, "Light Emitting Gallium Arsenide Diode," vol. 8, No. 1, June 1965, p.191.

JOHN W. HUCKERT, Primary Examiner

MARTIN H. EDLOW, Assistant Examiner

U.S. Cl. X.R.

313—108; 317—235